United States Patent [19]

Kataoka et al.

[11] Patent Number: 4,857,744
[45] Date of Patent: Aug. 15, 1989

[54] OPTICAL PROJECTION PRINTING APPARATUS WHEREIN WAFER MARK HAS A GRATING PITCH IN THE SAGITTAL PLANE OF THE FIRST OPTICAL SYSTEM

[75] Inventors: Keiji Kataoka, Kawagoe; Toshiei Kurosaki, Kodaira; Seiji Yonezawa; Soichi Katagiri, both of Hachiouji, all of Japan

[73] Assignee: Hitachi, Ltd., Tokyo, Japan

[21] Appl. No.: 224,654

[22] Filed: Jul. 27, 1988

[30] Foreign Application Priority Data

Jul. 29, 1987 [JP] Japan .................................. 62-187744
Feb. 3, 1988 [JP] Japan .................................. 63-21947

[51] Int. Cl.$^4$ ...................... G01N 21/86; G01B 11/00
[52] U.S. Cl. ..................................... 250/548; 356/401
[58] Field of Search ................. 250/548, 557; 356/400, 356/401

[56] References Cited

U.S. PATENT DOCUMENTS 4,592,625 6/1986 Uehara et al. ......................... 356/401
4,780,616 10/1988 Nishi et al. ............................ 250/548

OTHER PUBLICATIONS

Bouwhuis et al., Automatic Alignment System for Optical Projection Printing; 11/78, IEEE Transactions on Electron Devices, vol. ED-26, No. 4, Apr. 1979.

Primary Examiner—David C. Nelms
Assistant Examiner—William L. Oen
Attorney, Agent, or Firm—Antonelli, Terry & Wands

[57] ABSTRACT

An optical projection printing apparatus which can irradiate a mask with light from a first light source to focus the mask pattern on a resist of a semiconductor wafer in a highly accurate alignment by a first optical system including a projection lens. A wafer mark formed on the wafer to have a grating pattern shape is arranged to have its grating pitch direction located in the sagittal plane of the first optical system. The wafer mark is irradiated with the light coming from a second light source having a wavelength different from that of the first light source. Of the reflected light from the wafer mark, only the ± 1st order diffraction light is extracted by a filter and partially superposed on the mask in a transversely misaligned state so that the reflected light from the wafer mark may be focused by a second optical system. The aforementioned filter is disposed in the Fourier plane of the second optical system.

12 Claims, 8 Drawing Sheets

FIG. 7
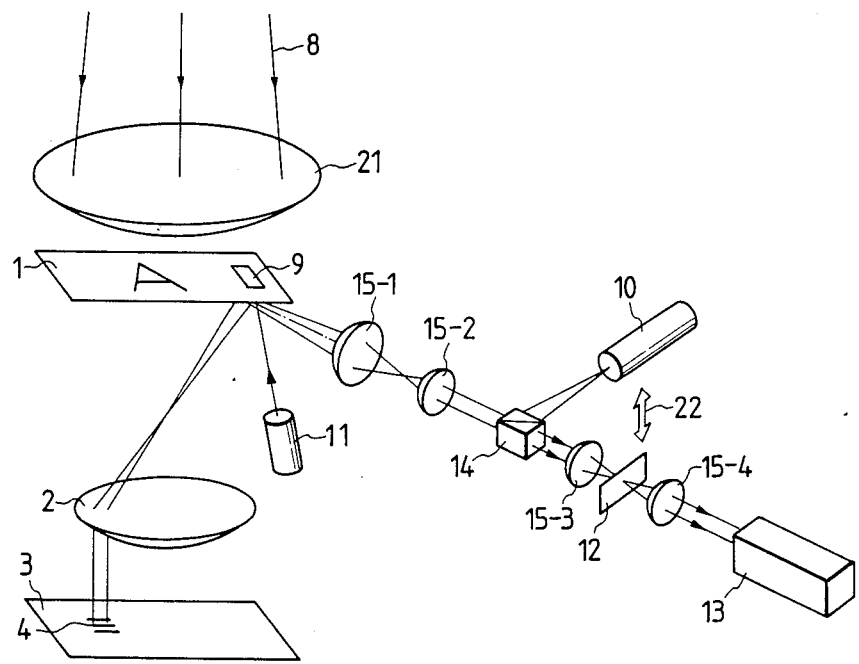
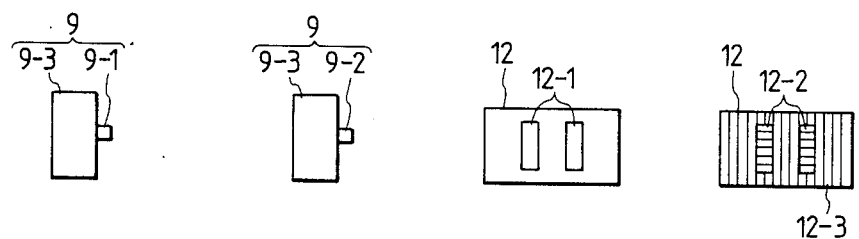

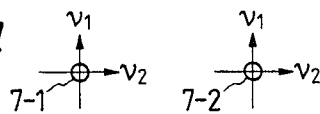
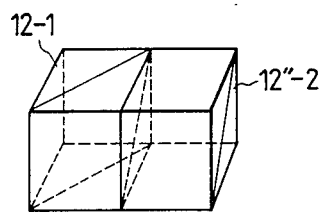
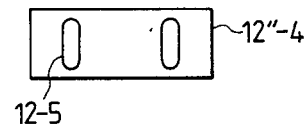
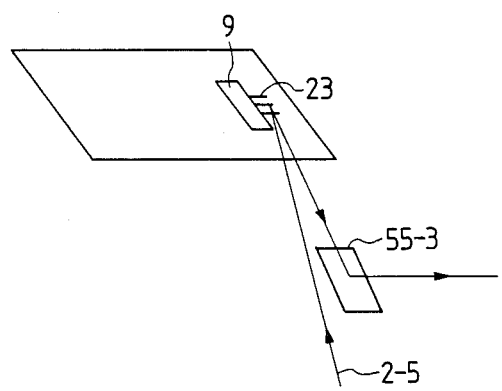
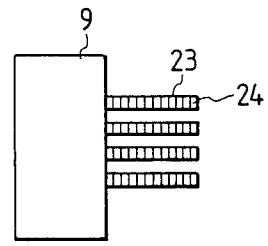

OPTICAL PROJECTION PRINTING APPARATUS WHEREIN WAFER MARK HAS A GRATING PITCH IN THE SAGITTAL PLANE OF THE FIRST OPTICAL SYSTEM

BACKGROUND OF THE INVENTION

The present invention relates to an optical projection printing apparatus capable of aligning a mask pattern with a semiconductor wafer in high accuracy.

The optical projection printing apparatus of the prior art has a structure shown in FIG. 1a, as described on pp. 723 of IEEE TRANSACTIONS ON ELECTRON DEVICES, VOL. ED-26, No. 4, April, 1979. In this apparatus, the light from a first light source (although not shown), i.e., the exposure light 8 passes through a condenser lens 30 into a mask 31. The light having transmitted through the mask 31 passes through projection lenses 32 and 33 to a wafer 34 to focus the image formed in the mask 31 on the wafer 34. The light source system thus constructed provides the so-called "Telecentric optical system" not only at the side of the object or mask 31 but also at the side of the image, i.e., the wafer 34, so that the main optical beam for the focusing is incident at a right angle upon the wafer 34 and the mask 31, as indicated by a broken line, at the sides of both the wafer 34 and the mask 31. For the light of alignment, a laser beam 35 is used as a second light source. This laser beam 35 is reflected by a small mirror 36 interposed between the projection lenses 33 and 32 and is incident in the grating pattern (i.e., the pattern, as designated at 4-1 in FIG. 1b) to be used as a wafer mark. Of the reflected lights from the grating pattern, only the ±1st order diffraction lights are selected by a special filter 37, which is interposed between the two projection lenses 32 and 33, and is focused on the mask 31. In one end portion of this mask 31, there is arranged the grating pattern as the mask pattern, which is aligned with the pattern from the wafer mark so that the misalignment between the wafer 34 and the mask 31 is detected by a later-described photodetector.

In order to raise the aligning accuracy, the following trial has been made in the prior art.

Designated at reference numeral 38-2 in FIG. 1a is a well-known Savart plate, by which double images are obtained. Double images composed of transversely shifted images of the wafer mark. And double images have perpendicularly polarized components each other. These double images are aligned with the mask mark. The result of a alignment is detected by a photo-detector (although not shown) through an optical element 38-1 which is composed of an electro-optical modulator and a detector. As is well known in the art, the optical element composed of the electro-optical modulator and the detector is enabled to timely alternately select the perpendicularly polarized components of the double images of the wafer mark by the voltage applied to the electro-optical modulator so that the double images of the wafer mark and the alignment signal of the mask mark can be timely separately obtained.

In the method described above, however, the transverse shift of the diffraction image have to be equal in high accuracy. For this high accuracy, the optical elements to be used have to be constructed in high accuracy and freed from any misalignment with time.

The prior art thus far described is limited in the following point and has a defect. If the wavelengths of the exposure light as the first light source and the aligning laser beam as the second light source are largely different, the correction of chromatic aberration of the projection lenses is not sufficient so that the light reflected from the aforementioned wafer mark cannot be focused on the mask 31. Thus, the prior art cannot be used.

In the optical system shown in FIG. 1a, the direction of the grating pitch of a wafer mark 4-1 is parallel with the direction of segment joining the point P intersection between the wafer 34 and an optical axis 100, and the wafer mark 4-1, as shown in FIG. 1b. In other words, in the prior art, as shown in FIG. 1b, the direction of the grating pitch of the wafer mark 4-1 composed of the grating pattern is contained in the so-called "meridional plane" 102, which is defined by the plane including the optical axis 100 of the first optical system shown in FIG. 1 and the position of the wafer mark.

Specifically, the position of the pattern, which is focused by the ±1st order diffraction lights on the mask 31, is located in the meridional plane (i.e., the plane of FIG. 1a) of the projection lenses shown in FIG. 1, that is, in the meridional plane of FIG. 1b. As a result, the center line (as indicated by the broken line in FIG. 1a) of the ±1st order diffraction lights, i.e., the main beam is not normal to the mask plane due to the chromatic aberration of the projection lenses. This causes a defect that the detected position by the aligning laser beam is misaligned.

Since, moreover, the filter for extracting the ±1st order diffraction lights from the wafer mark is interposed between the projection lenses 32 and 33, it may undesirably block a portion of the exposure light for transferring the mask pattern to the wafer.

SUMMARY OF THE INVENTION

In order to solve the above-specified problems, the present invention contemplates to provide an optical projection printing apparatus for irradiating a mask 31 with a light 8 from a first light source as an exposure light to focus it through projection lenses 32 and 33 thereby to expose a photosensitive material on a wafer to it. A grating pattern 4-1 is used as a wafer mark and is so arranged that the direction perpendicular to the grating pitch direction of said wafer mark is oriented in the optical direction extending through the projection lens center. The wafer mark is irradiated with the light from the second light source, which has a wavelength different from that of the first light source. Because of the chromatic aberration, diffraction lights from the wafer mark are not imaged on mask position. In one embodiment of the present invention, the ±1st order diffraction lights of the lights reflected from the wafer mark may be partially superposed each other with the transverse shift on the mask and the superposed portion are imaged on a photo-detector by the second optical system. Such an arrangement takes advantage that the second optical system has the ability to image diffraction lights from the wafer and also mask mark on a photo-detector in same optics. In another embodiment, the second optical system has the two different optical path for wafer mark and mask mark in order to image them on the same position. A filter 12 for extracting only the ±1st order diffraction lights of the reflected lights from the wafer mark is mounted on the Fourier plane of the second optical system.

In the present invention, moreover, the wafer mark and the mask mark are irradiated with the lights from the second light source for emanating two wavelengths different from those of the first light source. The lights reflected from the wafer mark and the mask mark are focused on the photo-detector by the second optical system. The filter for extracting only the ±1st order diffraction lights of the reflected lights is disposed on the Fourier plane of the second optical system with its slit being on the focal plane upstream of the photodetector. There is mounted a filter for transmitting the ±1st order diffraction lights with different wavelengths $\lambda_1$ and $\lambda_2$. A high alignment accuracy can be realized by comparing the phases of the optical detected signals for the frequency of $(\lambda_1 - \lambda_2)$, which are caused as a result of interferences between the ±1st order diffraction lights $\lambda_1$ and $\lambda_2$, with the reference signal of the second light source by means of a later-described phase comparator shown in FIG. 16. Thus, it is possible to provide an optical projection printing apparatus which can have a highly accurate alignment.

BRIEF DESCRIPTION OF THE DRAWINGS

FIG. 7 is a diagram showing the structure of an optical projection printing apparatus according to a first embodiment of the present invention;

FIGS. 8a and 8b are diagrams showing the mask marks of the embodiment;

FIGS. 9a and 9b are diagrams showing the respective filters of the embodiment;

FIGS. 16a, 16b, 16c and 16d are diagrams showing the polarized components and structure of the ±1st order diffraction lights for explaining the operations of other filters; and FIGS. 17a and 17b diagrams showing another embodiment of the present invention.

DESCRIPTION OF THE PREFERRED EMBODIMENTS

Figure 2A:
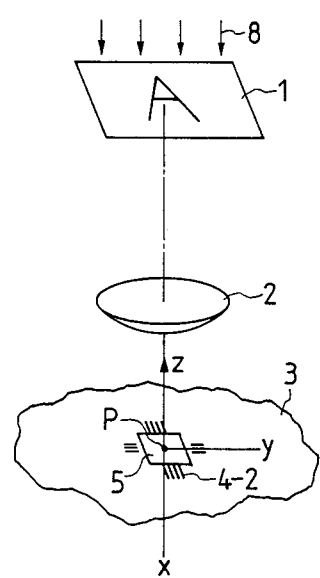
FIGS. 2a and 2b are diagrams for explaining the aligning principle of the optical projection printing apparatus.
Figure 2B:
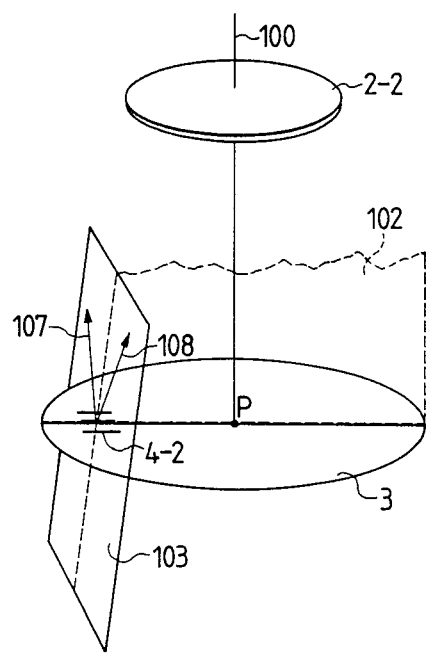
Figure 3:
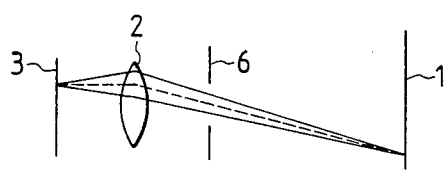
FIG. 3 is a diagram for explaining an optical system for an exposure light.

The principle of the present invention will be first described with reference to FIGS. 2a to 6. As shown in FIG. 2a, a wafer 3 is formed thereon with a wafer mark 4 which is composed of an IC pattern 5 and a grating pattern for wafer alignment. A mask pattern A on a mask 1 is focused on the wafer 3 through a projecting lens 2 with an exposure light 8 such that it is accurately aligned with and superposed upon the IC pattern 5 formed on the wafer 3. The present invention contemplates to provide an apparatus for accurately aligning the wafer 3 and the mask 1, as described above. First of all, the principle for aligning the position of the wafer 3 with the position of the mask 1 will be described with the use of the wafer mark 4. FIG. 3 is a diagram for explaining the x-z or y-z plane of the optical system for the exposure light 8. The exposure light 8 used is a laser beam of KrF having a wavelength of 248.4 nm, and the projection lens 2 used is made of synthetic quartz glass having a focal distance of 80 mm, for example, and a refractivity index of 1.50831 with a magnification of 1/5 for projecting the mask 1 on the wafer 3 in a reduced scale. In the telecentric arrangement having a diaphragm 6 positioned at the mask side focal point of the projection lens 2, the distance between the projection lens 2 and the wafer 3 become 96 mm, and the distance b between the projection lens 2 and the mask 1 is 480 mm. FIG. 4 is a diagram for explaining the optical system for the aligning laser beam. If a He-Ne laser having a wavelength of 632.8 nm is used as the aligning laser, the synthetic quartz making the projection lens 2 has a refractive index of 1.4571. As a result, the focal distance f of the projection lens 2 is highly changed from 80 mm to 89 mm so that the distance b' of the imaging point at the side of the mask 1 corresponding to the surface of the wafer 3 is highly misaligned from 480 mm to 1214 mm with respect to the mask 1.

In FIG. 2a, the direction perpendicular to the grating pitch direction is oriented to the point P of intersection between the optical axis extending through the center of the projection lens and the wafer 3. In other words, the grating pitch direction is contained in the sagittal plane of the projection lens. In this case, it can be said that the ±1st order diffraction lights emanating from a wafer mark 4-2 are contained in the sagittal plane 103 of the projection lens.

Figure 4A:
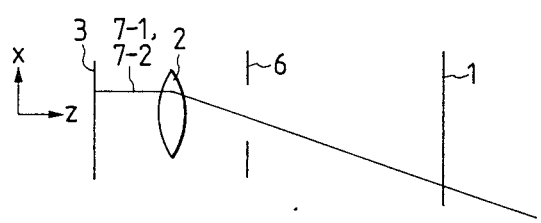
FIG. 4a is a diagram showing the projection of a reflected light from a wafer mark upon an x-z plane.
Figure 4B:
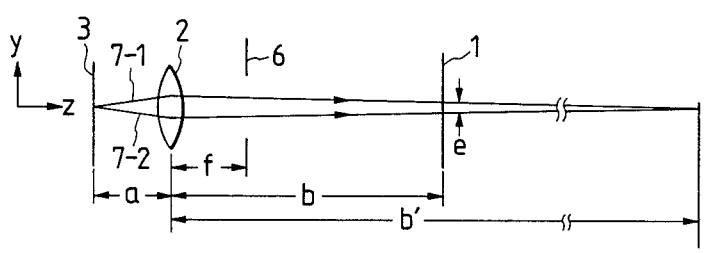
FIGS. 4b and 4c are diagrams showing the projection of the reflected light upon a y-z plane.

FIG. 4a is a diagram showing the projection of the light reflected from the wafer mark 4 shown in FIG. 9 upon the x-z (meridional) plane, and FIG. 4b is a diagram showing the projection of the focusing of the ±1st order diffraction images of the sagittal plane upon the y-z plane. The wafer mark 4 to be observed is located, as shown in FIG. 2a, and the direction of the wafer mark 4 normal to the grating pitch is oriented generally in the direction of the intersection point P between the x-axis, i.e, the x-axis of the projection lens 2 and the wafer 3.

Figure 1A:
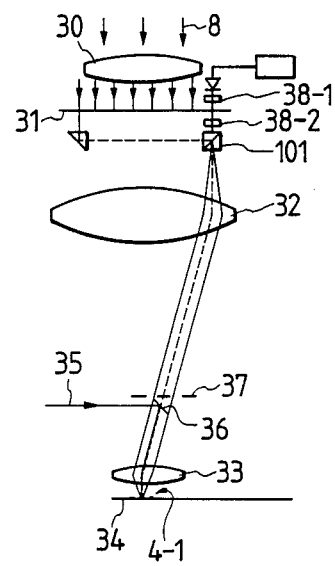
FIGS. 1a and 1b are diagrams showing the structure of the optical projection printing apparatus of the prior art.
Figure 1B:
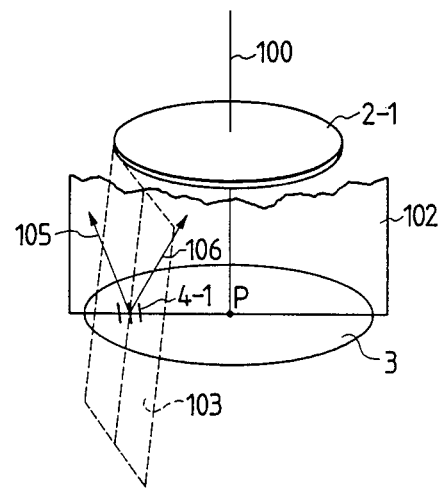
Figure 5:
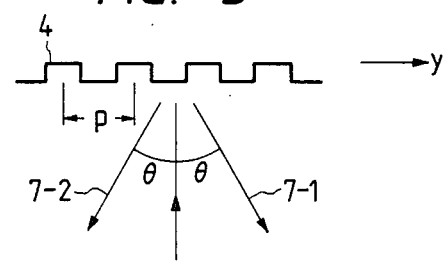
FIG. 5 is a diagram showing a grating.
Figure 6A:
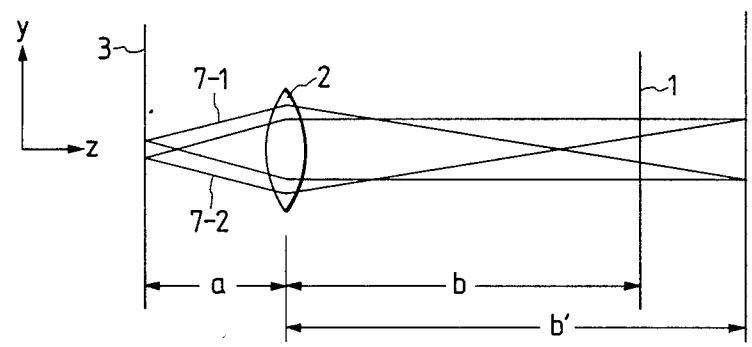
FIGS. 6a and 6b are diagrams for explaining the formations of the patterns of ±1st order diffraction lights at a mask position 1, respectively.
Figure 6B:
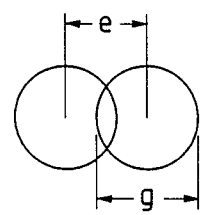

On the contrary to the prior art of FIG. 1b, in the case of the present invention, the direction of the grating pitch of the wafer mark 4-2 is contained in a plane normal to the aforementioned meridional plane 102, i.e., in the sagittal plane. This case is characterized in that the ±1st order diffraction lights are contained in the sagittal plane. In this case, moreover, the grating of the wafer mark 4 has undulations of pitch p, as shown in FIG. 5, and a relation of $p \sin\theta = m\lambda$, if the angle between the incident laser beam and its diffracted light is designated at $\theta$. Here, letter m designates the order of diffractions, and letter $\lambda$ designates the wavelength of the light. Now, for the pitch $p=8$ $\mu$m and the wavelength $\lambda=0.6328$ $\mu$m, the diffraction angle $\theta$ of the $\pm$1st order diffraction lights is $\pm 4.537$ degrees (i.e., 0.079 radians). FIG. 4b shows the $\pm$1st order diffraction lights 7-1 and 7-2. These 1st order diffraction lights intersect at the position of b' from the projection lens 2 to form an interference pattern. At the position of the mask 1 (which is located at the distance b from the projection lens 2), the $\pm$1st order diffraction lights are apart from each other, as shown in FIG. 4b. If this distance is designated at e, it is given by $e = -2a\theta(b'-b)/b'$ as long as 9.17 mm in this example. In order to form a pattern with the $\pm$1st order diffraction lights at the position of the mask 1, the 1st order diffraction lights are partially superposed with a transverse shift of e, as shown in FIGS. 6a and 6b. In other words, a setting of $e<g$ is made, as shown in FIG. 6b. Here, letter g designates the diameter of the $\pm$1st order diffraction lights at the mask position. Interference fringes corresponding to the wafer mark 4 are formed where the $\pm$1st order diffraction lights are superposed. In FIG. 6a, the grating pitch of the wafer mark 4 is oriented in the y-direction, and the wafer mark 4 is located at the center of the optical axis of the projection lens 2 in the projection of the y-z plane. As a result, the interference fringes in the vicinity of the plane of the mask 1 are arranged in parallel with the x-z plane and in the y-direction. Thus, the interference fringes are not misaligned, even if their observation point is defocused by the distance $b'-b$ so that the position of the wafer 3 can be accurately detected even on the surface of the mask 1.

The method described above is one requiring no correction of the chromatic aberration due to the difference in the wavelength between the exposure light and the aligning laser beam. It is, however, effective for accurately aligning the relative positions of the wafer mark and the mask mark to locate the intersection position of the $\pm$1st order diffraction lights, i.e., the imaging point of the wafer mark to the mask position.

Figure 4C:
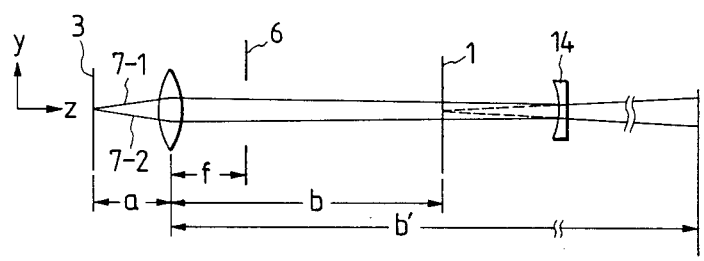
Figure 12:
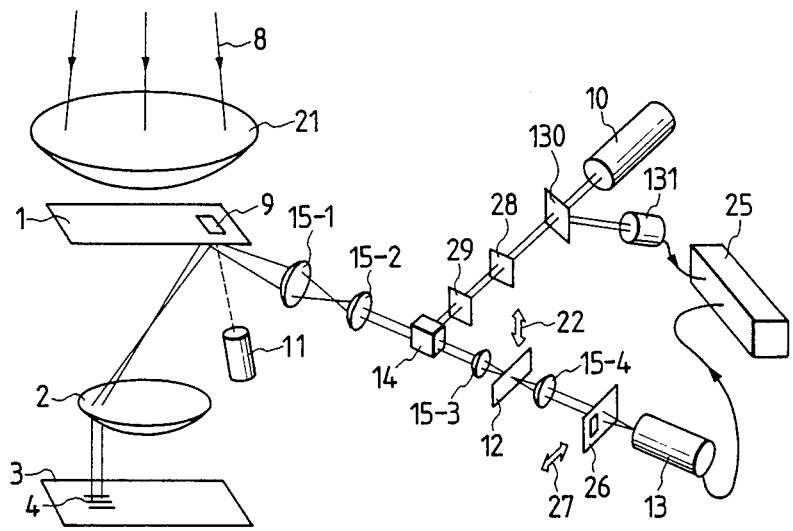
FIG. 12 is a diagram showing the structure of another embodiment of the present invention.

FIG. 4c shows an example in which a convex lens 14 is used as a chromatic aberration correcting element for correcting the chromatic aberration of the projection lens due to the wavelength difference between the exposure light as the first light source and the aligning laser beam as the second light source. The convex lens 14 is located to bring the imaging point of the wafer mark to the mask position. Next, let the case be considered in which the wafer mark is irradiated with a laser beam having two frequencies $v_1$ and $v_2$. The phase $\phi$ of the light reflected from the wafer mark 4 in FIG. 12 is expressed by the following expansion, wherein: letter 6 designates the position of the wafer mark; letter p designates the grating pitch; and letters $A_1$, $A_2$ and $A_3$ designate constants relating the grating shape and the groove depth:

$$\phi = A_1 \cos \frac{2\pi}{p} (y - \delta) + A_2 \cos \frac{4\pi}{p} (y - \delta) + \qquad (1)$$

$$A_3 \cos \frac{6\pi}{p} (y - \delta) + \cdots$$

The lights from the wafer mark are expressed by $e^{i\phi}$, and their 1st-order diffraction light $D_1$ is expressed by the following equation:

$$D_1 = iA_1 \cos \frac{2\pi}{p} (y - \delta) \qquad (2)$$

$$= \frac{iA_1}{2} \left\{ \exp \left[ i \frac{2\pi}{p} (y - \delta) \right] + \exp \left[ -i \frac{2\pi}{p} (y - \delta) \right] \right\}$$

The above equation has neglected the frequency of the light but is changed into the following form, if the $+$1st order selects the frequency $v_1$ whereas the $-$1st order selects the frequency $v_2$:

$$D_1 = \frac{iA_1}{2} \left\{ \exp(i2\pi V_1 t) \exp \left[ i \frac{2\pi}{p} (y - \delta) \right] + \exp(i2\pi v_2 t) \exp \left[ -i \frac{2\pi}{p} (y - \delta) \right] \right\} \qquad (3)$$

A similar equation is obtained if those $\pm$1st order diffraction lights are focused by the optical system having the magnification m. In the above equation, the following transformations have to be made: $p \rightarrow mp$; $\delta \rightarrow m\delta$; and y to the coordinates in the focal point. Here, the description will be made with the magnification of $m=1$ for simplicity. The optical intensity of the refocused image of the $\pm$1st order diffraction lights by the optical system is expressed by $|D_1|^2$ of the above equation.

$$|D_1|^2 = \frac{A_1^2}{2} \left\{ 1 + \cos \left[ 2\pi(v_1 - v_2)t + \frac{4\pi}{p} (y - \delta) \right] \right\} \qquad (4)$$

If the optical intensity of the portion of $y=0$ of the focal pattern $|D_1|^2$ of the $\pm$1st diffraction images is selected by means of slit and optically detected, then the above equation is expressed by:

$$|D_1^2 (y = 0)| = \qquad (5)$$

$$\frac{A_1^2}{2} \left\{ 1 + \cos \left[ 2\pi(v_1 - v_2)t - \frac{4\pi}{p} \cdot \delta \right] \right\}$$

If the lights $e^{i2\pi v_1 t}$, $e^{i2\pi v_2 t}$ of the laser are interfered to use the heterodyne signal of the laser itself as a reference signal, the following equation is obtained:

$$|D_0|^2 = |\exp i2\pi v_1 t + \exp^{i2\pi v_2 t}|^2 = 2 [+\cos 2\pi(v_1 - v_2)t] \qquad (6)$$

The position 6 of the wafer mark can be detected by comparing the phases of $$\cos \left[ 2\pi(v_1 - v_2)t - \frac{4\pi}{p} \delta \right]$$

of the equation (5) and $\cos 2\pi(v_1 - v_2)t$ of the equation (6). In the deduction of the equation (5), the optical intensity for $y=0$ is selected by the slit. The wider slit is desirable in view of the sensitivity of detecting the optical intensity. However, the signal components become the smaller for the excessively intense light. If the width of the slit at a position Y is designated at W, the amount of light entering the slit is given by the following equation:

$$\int^{y+W/2} |D_1|^2 dy = \frac{A_1^2}{2} W \left(1 + \frac{\sin\left(\frac{2\pi W}{P}\right)}{\left(\frac{2\pi W}{P}\right)} \cos\left[2\pi(\nu_1 - \nu_2)t + \frac{4\pi}{P}(y - \delta)\right]\right) \quad (7)$$

The maximum signal amplitude is obtained for the maximum $$W \times \frac{\sin(2\pi W/P)}{2\pi W/P},$$

i.e., when the slit width W is about P/4.

As has been described, if the method of determining the position of the wafer mark by the phase comparison can determine the phase difference $\delta$ with an accuracy of 1/1,000 of the signal period of $1/(\nu_1-\nu_2)$, the position $\delta$ of the wafer mark is determined with a high accuracy of $P/4\pi) \times 1/1,000$.

The description thus far made is directed to the detection of the wafer mark, but it is apparent to make a detection on the basis of a similar principle if a similar grating is formed on the mask mark.

In FIG. 7 showing the first embodiment of the present invention, the exposure light 8 from an excimer laser passes through a condenser lens 21 to transfer the pattern A on the mask 1 to the wafer 3. The alignment of the wafer 3 with respect to the mask 1 is accomplished in the following manner. A He-Ne laser 10 is used as the aligning laser. The light from the He-Ne laser 10 is reflected by a half mirror 14 to pass through lenses 15-2 and 15-1. The light is then reflected by the reflecting mirror portion (as designated at 9-3 in FIGS. 8a and 8b) of a mask mark 9 on the mask 1 to pass through the projection lens 2 until it comes into the wafer mark 4. The light diffracted by the wafer mark 4 inversely follows the incident optical path to pass through the half mirror 14. After this, only the ±1st order diffraction lights are transmitted through a filter 12 to reach a two-dimensional photo-detector 13. Incidentally, the filter 12 is arranged in a position to form the Fourier image of the grating pattern formed on the mask mark.

The aforementioned lens systems 15-1, 15-2, 15-3 and 15-4 focus the optical pattern of the mask mark 9 on the two-dimensional photo-detector 13. A light source 11 is used to detect the position of the mask 1 to illuminate the mask mark 9-1 or 9-2 shown in FIGS. 8a and 8b. This mask mark 9-1 or 9-2 is focused on the two-dimensional photo-detector 13 by the optical system of the lenses 15-1 to 15-4. At this time, the filter 12 is unnecessary and is extracted out of the optical system, as indicated by arrow 22. Incidentally, this extracting means can be exemplified by well-known suitable means.

FIGS. 8a and 8b show other examples of the mask marks 9, of which the mark 9-3 is the reflecting mirror portion whereas the marks 9-1 and 9-2 are used for aligning the mask 1. The mark 9-2 has a contour similar to the mark 9-1 but is formed therein with a grating so that the light reflected from the grating can sufficiently enter the optical systems 15-1 to 15-4 even if the mask aligning light source 11 is sufficiently apart from the passage space of the exposure light 8. Thus, during the exposure, the exposing light is prevented from being shielded by an obstruction such as the light source 11. FIGS. 9a and 9b show two examples of the filter 12. In FIG. 9a, the filter 12 is formed with holes 12-1 for transmitting the ±1st order diffraction lights therethrough. In FIG. 9b, the filter 12 is composed of a polarizing element having a place 12-2 for transmitting the ±1st order diffraction lights and a polarizing element having another place 12-3. The directions of the transmitting polarized lights are at 90 degrees with respect to each other. In this case, the diffraction light reflected from the wafer 3 has a polarizing direction perpendicular to that of the place 12-3 so that it may be shielded by the place 12-3. Moreover, the light from the mask aligning light source 11 is unpolarized so that its focusing may not be deteriorated by the filter 12, polarized at 45 degrees with respect to the polarized directions of the places 12-2 or 12-3, or circularly polarized. Then, as shown in FIG. 7, it is unnecessary to bring the filter 12 into or out of the optical system.

Figure 10A:
FIGS. 10a and 10b are diagrams showing two examples of the wafer mark of the embodiment.
Figure 10B:
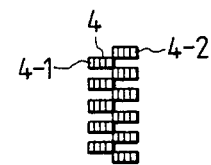
Figure 11A:
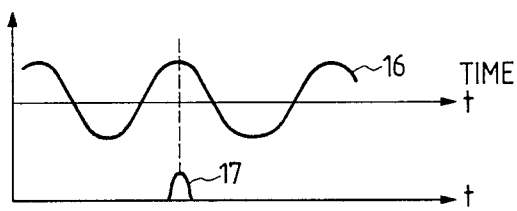
Figs. 11a, 11b and 11c are diagrams for explaining the operations of the embodiment.
Figure 11B:
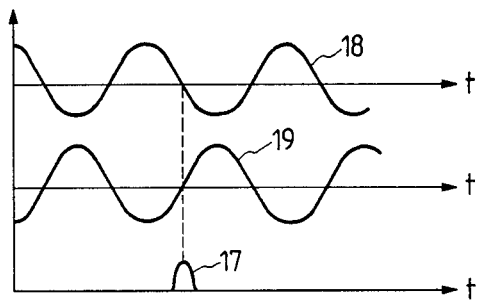

FIGS. 10a and 10b show two examples of the wafer mark 4. The light pattern from the wafer mark 4 having the construction of FIG. 10a is guided trough the optical path, which has been described with reference to FIG. 1, and is then detected by the two-dimensional photo-detector 13. An example of the optically detected signal, which is monitored by a synchroscope, is indicated by a curve of signal 16 of FIG. 11a, and an example of the signal from the mask mark 9-1, which is detected by the two-dimensional photo-detector 13, is indicated by a curve 17. If these optically detected signals 16 and 17 are aligned with their peak values in these examples, the mask 1 and the wafer 3 can be precisely aligned. On the other hand, FIGS. 11b and 10b show examples, in which the signals 18, 19 and 17 from the wafer marks 4-1 and 4-2 and the mask mark 9-1 are detected for alignments. Specifically, the optically detected signals based upon the wafer marks 4-1 and 4-2 have a phase shift of 180 degrees, as indicated by curves 18 and 19 shown in FIG. 11b.

Figure 11C:
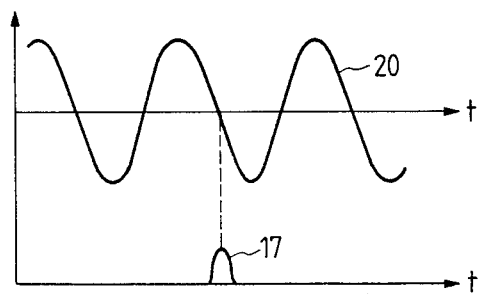

In this example, the alignments are accomplished with the signal curves 18 and 19, their zero values (or zero cross points) and the peak value of the signal curve 17. Incidentally, this case is advantageous in that the optically detected signals 18 and 19 have their DC components and noises reduced if they are differentially amplified. A cure 20 plotted in FIG. 11c indicates the differential amplifications of the signals 18 and 19 shown in FIG. 11b. Accurate alignments can be accomplished by comparing the zero value of the signal 20 with the peak value of the signal 17 obtained from the mask mark 9-1 or 9-2.

Figure 13A:
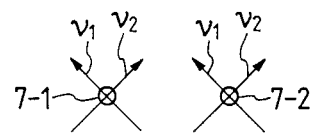
FIG. 13a is a diagram showing the respective polarized components of the ±1st order diffraction lights.
Figure 13B:
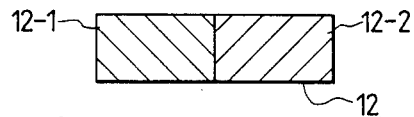
FIGS. 13b, 13c and 13d are diagrams showing different filters.
Figure 13C:
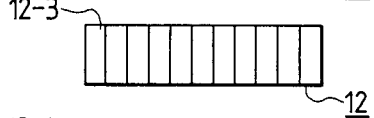
Figure 13D:
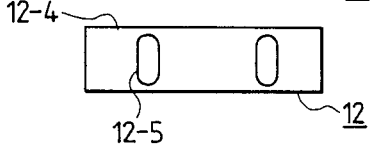

FIG. 12 is a diagram showing the structure of the second embodiment of the present invention. The alignment of the wafer 3 with respect to the mask 1 is accomplished in the following manner. The wafer aligning laser 10 is exemplified by the so-called "Zeeman laser", to which the Zeeman effect is applied. Specifically, if a magnetic field is applied in the axial direction of the He-Ne laser tube, the left and right circularly polarized light having two oscillating frequencies, in which is left a frequency of about 1.8 MHz separated by the Zeeman effect. If the laser beam is guided through λ/4 and λ/2 plates 28 and 29, they are turned into two kinds of linear polarized lights having their planes of polarization normal to each other and having different frequencies. The laser beam is reflected by the half mirror 14 and guided through the lenses 15-1 and 15-2 and then is reflected by the reflecting mirror portion (as designated at 9-3 in FIGS. 8a and 8b) of the mask mark 9 of the mask 1. The beam thus reflected is guided through the projection lens 2 to enter the wafer mark designated at 4 in FIG. 10a. The light diffracted by the wafer mark 4 inversely follows the incident optical path and has only its ±1st order diffraction lights transmitted through the half mirror 14 and the filter 12 until they reach the photodetector 13 through a slit 26. The lens systems 15-1 to 15-4 are designed to focus the optical pattern of the mask mark 9 upon the photo-detector 13. As shown in FIG. 13a, the 1st order diffraction lights 7-1 and 7-2 are so set by the λ/2 plate 29 as to have their polarized components directed in the directions of arrows and to have frequencies $\nu_1$ and $\nu_2$, as shown. Shown in FIGS. 13b, 13c and 13d are the filters 12, of which the filter 12-1 and 12-2 are those for transmitting only the diffraction lights in the fringe direction therethrough. Specifically, the filter 12-1 transmits the light having the $\nu_1$ component, whereas the filter 12-2 transmits the light having the $\nu_2$ component. The filter 12-3 shown in FIG. 13c transmits the polarized component of about 45 degrees with respect to the polarizing directions of the filters 12-1 and 12-2 so that the lights of the frequency components may interfere on the photo-detector 13.

A filter 12-4 shown in FIG. 13d is used to shield 0th and higher order diffraction lights. The filter 12-4 has its slit 12-5 transmitting only the ±1st order diffraction lights to guide them onto the photo-detector 13.

The slit 26 of FIG. 12 is scanned, as indicated by arrow 27, and the optically detected signals in the respective scanning positions are detected by the photodetector 13. The light emanating from the wafer aligning laser 10 is partially guided through a half mirror 130 into a photo-detector 131, the optically detected signal of which is inputted as a reference signal to a phase comparator 25. The optically detected signal at each scanning position of the slit 26 is also inputted to the phase comparator 25 so that their phase difference δ can be determined by the phase detector 25. This phase difference δ has a direct relation to the position of the wafer mark 4 to determine the wafer position.

The light source 11 locates the mask position to illuminate the position 9-1 or 9-2 of the mask mark 9 shown in FIGS. 8a and 8b. The mask mark 9 is focused on the photo-detector 13 through the optical systems 15-1 to 15-4. When the mask mark 9 is detected, the filter 12 is extracted, as indicated by the arrow 22, out of the optical path of the optical systems 15-1 to 15-4.

The second embodiment described above uses the Zeeman laser as the wafer aligning light source 10 but may use an apparatus for generating two kinds of lights having different states of polarizing light and different frequencies due to the acoustic-optical effect.

Each of the embodiments uses the optical system, in which the reflected light from the wafer mark 4 is reflected by the mask 1, but should not be limited thereby and may use an optical system in which the same light is allowed to transmit through the mask 1.

Figure 14:
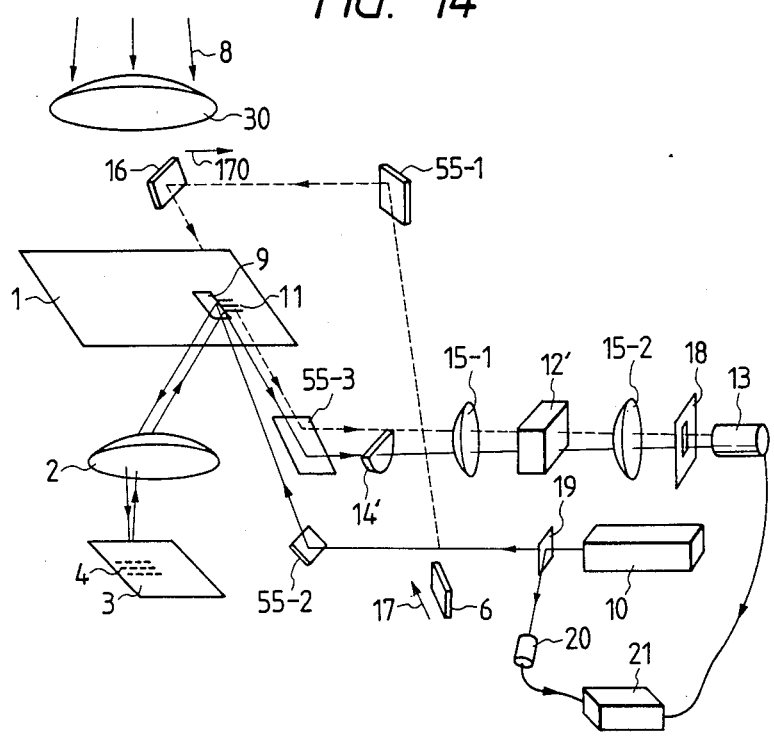
FIG. 14 is a diagram showing still another embodiment of the present invention.

In FIG. 14, the exposure light from an excimer laser or a mercury lamp is guided through a condenser lens 30 to transfer the pattern of the mask 1 to the wafer 3.

As the laser for aligning the wafer and the mask, there is used the He-Ne laser (which may be called the Zeeman laser) 10 which utilizes the Zeeman effect for oscillating a laser beam having two different wavelengths. The detection of the wafer mark is accomplished in the following manner. The laser beam emanating from the Zeeman laser 10 is reflected on the mirror 55-2 and further on the reflecting surface of the mask to irradiate the wafer mark 4 of the wafer 3. The diffracted light from the wafer mark 4 inversely follows the optical path through the reflecting surface of the mask 1 and is reflected by the mirror 55-3 to pass through the convex lens 14' cut by half, which acts as the chromatic aberration correcting element. As has been described before with reference to FIG. 3c, the convex lens 14' as the chromatic aberration correcting element is used to align the focal position of the wafer mark with the mask position. As shown in FIG. 14, the lens 15-1 is one having its focal point located at the mask position. In the rear focal plane of the lens 15-1, there is arranged a special filter 12' for extracting only the ±1st order diffraction lights. The ±1st order diffraction lights emanating from the special filter 12' are focused on the slit 18 by the lens 15-2, and their optical intensity is detected by the photo-detector 13.

Figure 15A:
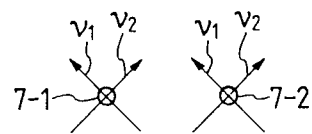
FIG. 15a is a diagram showing the respective polarized components of the ±1st order diffraction lights.
Figure 15B:
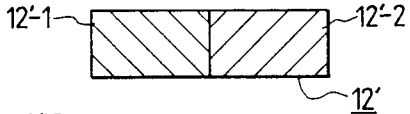
FIGS. 15b, 15c and 15d are diagrams showing different filters.
Figure 15C:
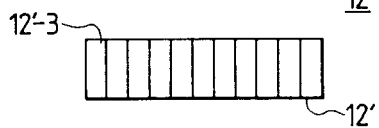
Figure 15D:
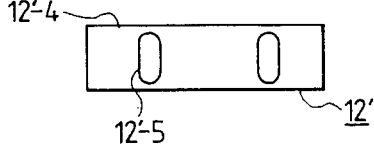

The filter 12' shown in FIG. 14 is so constructed as is shown in FIGS. 15a to 15d and 16a to 16d. As shown in FIG. 15a, the ±1st order diffraction lights 7-1 and 7-2 are set to have their polarized components directed in the directions of arrows and have frequencies $\nu_1$ and $\nu_2$, as shown. Designated at numeral 12' in FIGS. 15b to 15d are filters 12'-1 and 12'-2 for transmitting only the polarized lights in the fringe directions. The filter 12'-1 transmits only the light component $\nu_1$ of the diffracted light 7-1, whereas the filter 12'-2 transmits only the light component $\nu_2$ of the diffraction light 7-2. A filter 12'-3 shown in FIG. 15c transmits only the polarized component in a direction perpendicular to the spacing direction of the ±1st order diffraction lights so that the lights of the individual frequency components may interfere in the photo-detector 13. A slit 12'-4 shown in FIG. 15d shields the 0th and higher order diffraction lights. The ±1st order diffraction lights are transmitted through a slit 12'-4. FIGS. 16a to 16d show other structures of the filter. Let is be assumed that the direction of polarization of the ±1st order diffraction lights be set, as shown in FIG. 16a~FIG. 16d shows PS separation prisms 12''-1 and 12''-2, of which the prism 12''-1 transmits the horizontally polarized light (having the frequency component $\nu_2$) whereas the prism 12''-2 transmits the vertically polarized light (having the frequency component $\nu_1$). The lights having passed through the PS separation prisms further pass through a polarizing element 12''-3, which is set at 45 degrees with respect to the polarizing directions of the ±1st order diffraction lights, and their 0th order and higher order diffraction lights are shielded.

As shown in FIG. 14, the optically detected signal of the wafer mark detected by the photo-detector 13 is subjected to a phase comparison with the optically detected signal, which is guided from the laser beam of the aligning laser 10 into the photo-detector 20 by the half mirror 19, by the phase detector 21 to locate the wafer position.

The detection of the mask mark is accomplished in the following manner. If the mirror 6 is moved in the direction of arrow 17 into the optical path of the aligning laser beam, the laser beam emitted from the aligning laser 10 advances, as indicated by broken lines and arrows, to pass through a mirror 55-1 and the mirror 16 and irradiates the mask mark 11. The diffraction lights of the mask mark are reflected by the mirror 55-3 and guided into the lens 15-1. If, at this time, the chromatic aberration correcting element, which is the convex lens cut by half, is designed to transmit none of the light the mask mark can be focused on the position of the slit. As a result, it is possible to locate the position of the mask mark on the principle similar to that for the detection of the position of the wafer mark.

Thus, the wafer and the mask can be highly accurately aligned from the information of the positions of the wafer mark and the mask mark thus detected. When this alignment is completed, the exposure light 8 irradiates the mask 1 to transfer the mask pattern to the wafer. At this time, the portion of the optical system used for the alignment has to be retracted for relief, as indicated by the arrow 170, if the mirror 16 and so on pass across a portion of the exposure light.

FIG. 17 shows another embodiment, in which has a mask pattern 23 has a grating 24 of fine pitches arrayed within coarse pitches in a direction perpendicular to the grating array direction. If, in this case, the mask mark is irradiated with the aligning laser beam 25, it is diffracted and returned in the direction toward the irradiation by the grating of fine pitch in the mask mark so that a portion of the exposure light is not shielded with an advantage, as different from the mirror 16 of FIG. 14.

As has been described hereinbefore, according to the optical projection printing apparatus of the present invention, the light from the first light source is caused to irradiate the mask and is focused on the wafer by the first optical system including the projection lens to expose the photosensitive material. The wafer mark having the grating pattern on the wafer is arranged such that a direction perpendicular to the grating pitch direction is directed toward the point of intersection between the optical axis extending through the center of the projection lens and the wafer. The wafer mark is irradiated with the light coming from the second aligning light source for emitting the lights of two wavelengths which are different from those of the first light source or additionally different from the state of polarization light, to partially superpose the ±1st order diffraction lights of the lights reflected from the wafer mark are partially superposed with a transverse shift on the mask so that the reflected light from the wafer mark is focused on the photo-detector by the second optical system. On the Fourier plane of this second optical system, there are mounted either the filter for extracting only the ±1st order diffraction lights of the reflected light or the filter for extracting only the ±1st order diffraction lights and for transmitting the same with different wavelengths. Thus, a precise alignment can be obtained on the basis of the optically detected signals. Since, moreover, the lights having two wavelengths in different states of polarization lights are used as the second light source so that the alignment can be accomplished by comparing the phase of the optically detected signal corresponding to the frequency generated as a result of the interference of the ±1st order diffraction lights with that of the reference signal of the second light source, it is possible to realize the alignment of the mask and the wafer in high accuracy.

What is claimed is:

1. An optical projection printing apparatus comprising a first optical system for irradiating a mask with light coming from a first light source to focus the mask image on a wafer, said apparatus further comprising:
   a wafer having a wafer mark shaped such that the wafer mark having a grating pattern shape formed on said wafer has its grating pitch direction arranged in the sagittal plane of said first optical system; and
   a second optical system including means for irradiating said wafer mark with light from a second light source adapted for a wavelength different from that of the light from said first light source, and means for focusing the light reflected by the irradiated wafer mark onto a photo-detector.

2. An optical projection printing apparatus according to claim 1 focusing only the ±1st order diffraction light of said reflected light onto the photo-detector in said second optical system.

3. An optical projection printing apparatus according to claim 2, wherein said second optical system has its Fourier plane provided with a filter for extracting only said ±1st order diffraction light as the reflected light from said wafer mark.

4. An optical projection printing apparatus according to claim 1, further comprising means for superposing the +1st order diffraction light each other of said reflected light onto said mask, and means for focusing the mask images obtained by said ±1st order diffraction light onto said photo-detector.

5. An optical projection printing apparatus according to claim 3, wherein said filter includes a polarizing element having a polarizing direction perpendicular to the polarized light of the reflected light from said wafer mark and arranged outside of the optical path of said ±1st order diffraction light.

6. An optical projection printing apparatus comprising a first optical system for irradiating a mask with light coming from a first light source to focus the mask image on a wafer, said apparatus further comprising:
   a wafer having a wafer mark shaped such that the wafer mark having a grating pattern shape formed on said wafer has its grating pitch direction arranged in the sagittal plane of said first optical system; and
   a second optical system including means for irradiating said wafer mark with light from said second light source adapted for a wavelength different from that of the light from said first light source, and means for focusing only the ±1st order diffraction light of the reflected light from said wafer mark onto a photodetector,
   wherein said wafer mark has at least two grating patterns shifted with respect to each other to establish a difference in magnitude between the detected signals of said grating patterns.

7. An optical projection printing apparatus comprising a first optical system for irradiating a mask with light coming from a first light source to focus the mask image on a wafer, said apparatus further comprising:
   a second optical system including means for irradiating said wafer mark with light from said second light source adapted for a wavelength different from that of the light from said first light source, and means for producing light at two wavelengths and in different states of polarization from said second light source, wherein said second optical system has its Fourier plane provided with a filter for extracting only the ±1st order diffraction light of the reflected light of said wafer mark and transmitting said ±1st order diffraction light at different wavelengths.

8. An optical projection printing apparatus comprising a first optical system for irradiating a mask with light coming from a first light source to focus the mask image on a wafer, said apparatus further comprising:
a second optical system including means for irradiating a wafer mark and a mask mark, respectively, with light coming from a second light source for emitting light at two different wavelengths different from those of the light from said first light source, and means for focusing the reflected light from said wafer mark and said mask mark onto a photo-detector, wherein said second optical system has its Fourier plane provided with a filter for extracting the ±1st order diffraction light of said reflected light, and a slit is disposed on a focal plane located in front of said photo-detector.

9. An optical projection printing apparatus according to claim 8, further comprising a chromatic aberration correcting optical element disposed in said second optical system for separating the reflected lights from said mask mark and said wafer mark to be focused both of said marks on a common slit.

10. An optical projection printing apparatus according to claim 8, wherein said second light source emits two wavelengths in different states of polarization light, and wherein said filter includes two PS separation prisms arranged at a right angle with respect to each other for selecting the ±1st order diffraction light coming from said wafer mark and said mask mark and for discriminating the states of polarization light.

11. An optical projection printing apparatus according to claim 8, wherein said slit has a width of about $mp/4$ where m is the magnification factor of the optical system extending from said wafer mark or said mask mark to said slit p is the grating pitch of said mask mark or said wafer mark.

12. An optical projection printing apparatus according to claim 8, further comprising means for superposing only the ±1st order diffraction light each other of said reflected light onto said mask, and means for focusing the mask images obtained by said ±1st order diffraction light onto said photo-detector.

* * * * *